United States Patent [19]

Gilligan

[11] Patent Number: 4,473,892
[45] Date of Patent: Sep. 25, 1984

[54] RUGGED, VIBRATION RESISTANT MAGNETIC CORE STACK HAVING LOW MASS

[75] Inventor: Thomas J. Gilligan, Rolling Hills Estates, Calif.

[73] Assignee: Ampex Corporation, Redwood City, Calif.

[21] Appl. No.: 269,474

[22] Filed: Jun. 2, 1981

[51] Int. Cl.³ .............................................. G11C 5/05
[52] U.S. Cl. ........................................ 365/51; 29/604
[58] Field of Search .................... 365/51, 54, 55, 130; 29/604, 606, 609, 737, 738

[56] References Cited

U.S. PATENT DOCUMENTS

| | | | |
|---|---|---|---|
| 3,245,059 | 4/1966 | Eiseman et al. | 365/51 |
| 3,582,910 | 6/1971 | Drager | 365/55 |
| 3,594,897 | 7/1971 | Fulton | 29/604 |
| 3,671,811 | 6/1972 | Ezaki | 365/51 |

OTHER PUBLICATIONS

IBM Technical Disclosure Bulletin-vol. 11, No. 7, Dec. 1968, p. 726.

Primary Examiner—James W. Moffitt
Attorney, Agent, or Firm—Harry G. Thibault; Joel D. Talcott

[57] ABSTRACT

A magnetic core stack is comprised of a laminate of individual layers of substantial thinness mounted on a common stiff base member to provide a rugged, low mass structure of high resonant frequency. Each of the individual layers is comprised of a plurality of magnetic cores held in place by soft, energy absorbing material such as silicone rubber coated on the surfaces of opposite ground plane forming materials such as very thin sheets of aluminum. The laminate is formed from a single layer of material which supports a layer of magnetic cores and which is folded over upon itself one or more times to form the separate layers of the laminate. In one embodiment, a sheet of aluminum coated with silicone rubber on both sides is inserted as the single layer of material is initially folded over to form a two layer stack in which each layer of cores is held between opposite sheets of aluminum by silicone rubber coated on the aluminum. The two layer stack may then be folded over on itself one or more times to form a four or six layer laminate. In an alternative embodiment the single layer of material is comprised of opposite sheets of silicone rubber coated aluminum having a layer of tape on one of the silicone rubber coatings and sandwiching a layer of cores therebetween. The resulting arrangement is then folded over upon itself one or more times to form a multilayer laminate with the facing sheets of aluminum being held together with adhesive. Portions of the edges of the single layer of material are extended and mount X and Y diode boards which are mounted in spaced-apart relation with the laminate on the common stiff base member to form a memory module along with certain other components.

12 Claims, 16 Drawing Figures

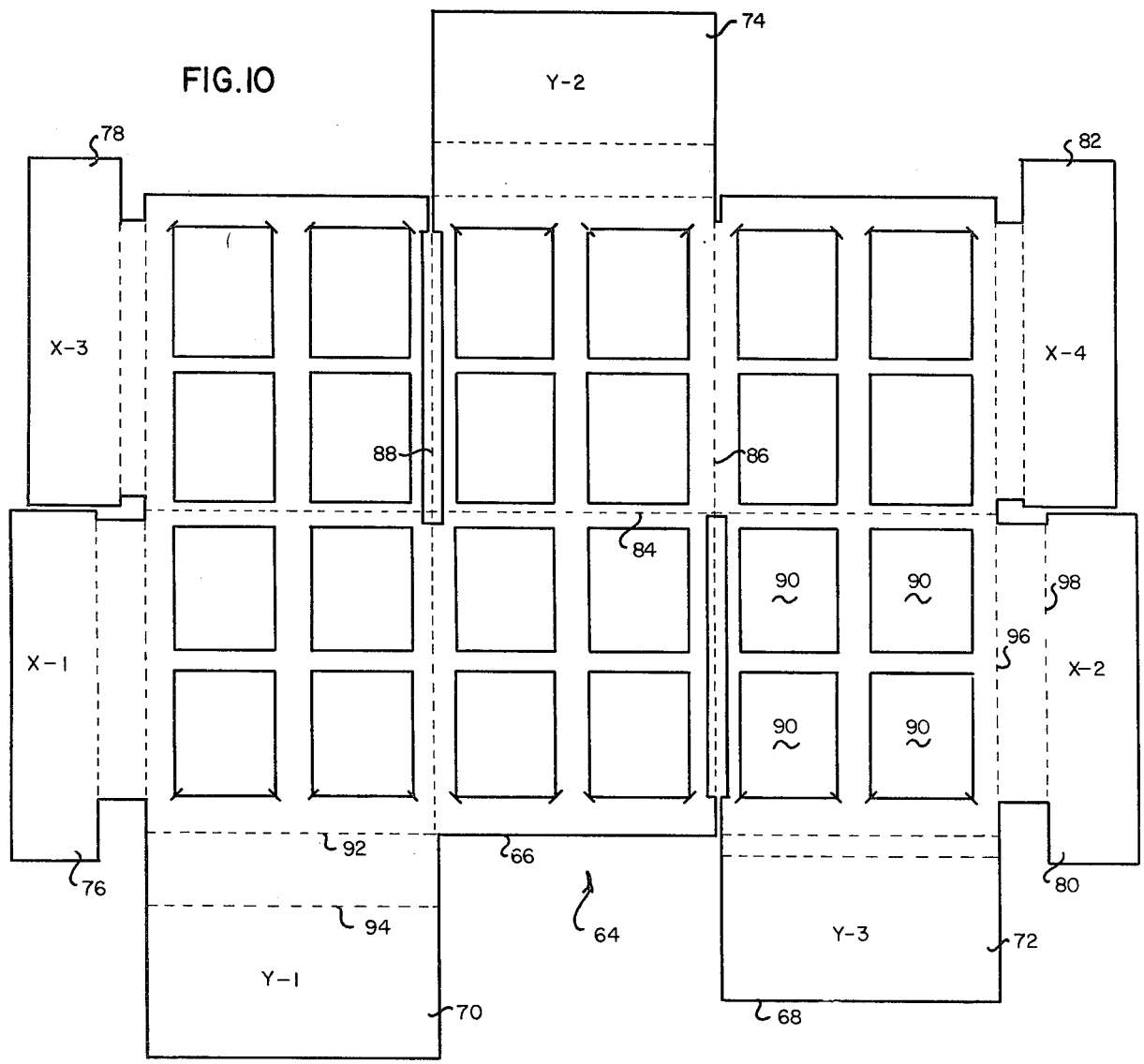
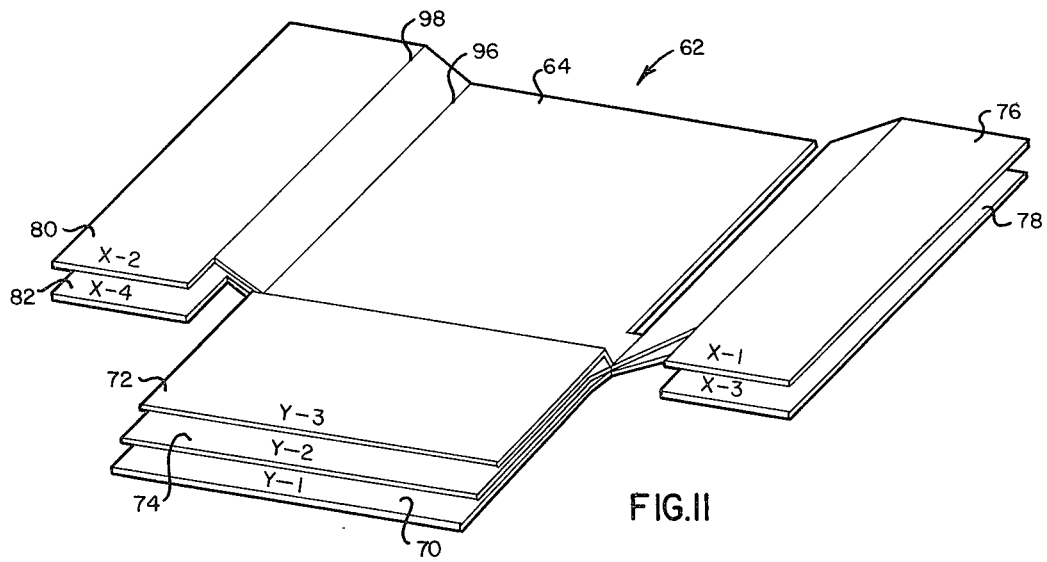

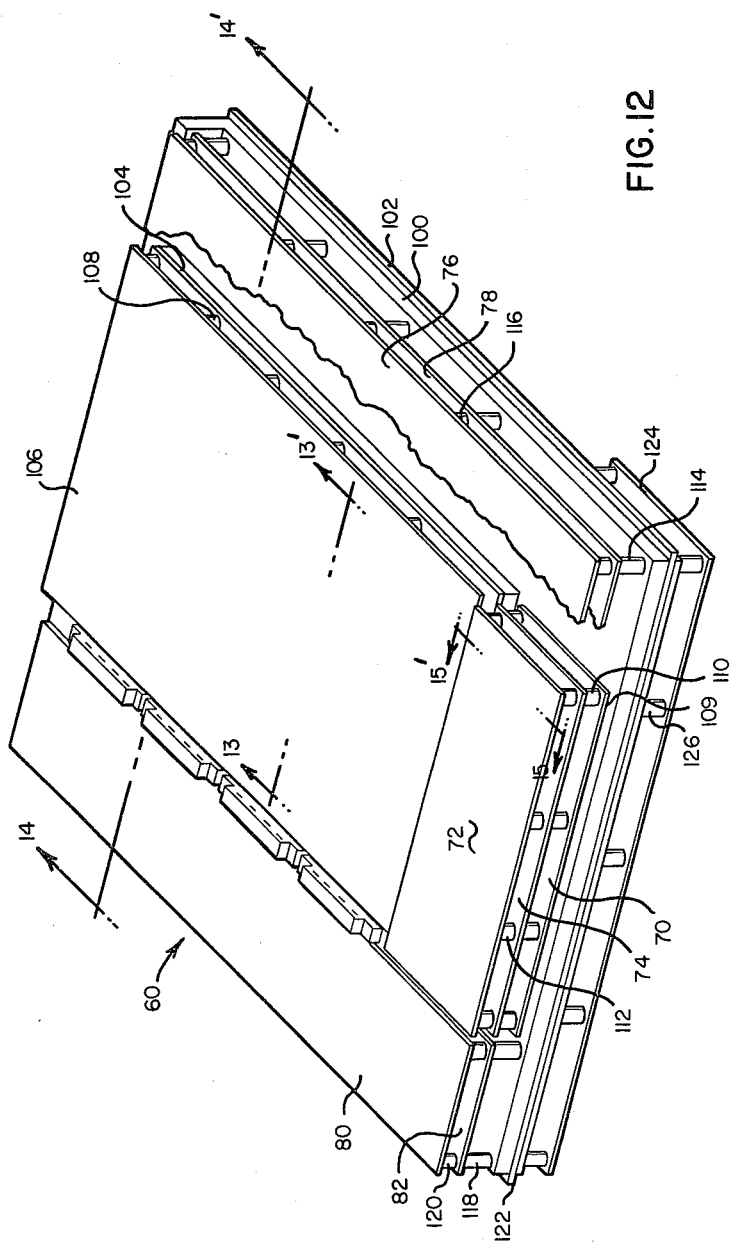

RUGGED, VIBRATION RESISTANT MAGNETIC CORE STACK HAVING LOW MASS

BACKGROUND OF THE INVENTION

Certain applications of magnetic core stacks require that the stacks be sufficiently rugged so as to withstand substantial vibration. Such applications include use in moving vehicles, both military and others, and various airborne vehicles such as aircraft, spacecraft and missiles.

Magnetic core stacks which are subjected to vibration may fail for various reasons. Stacks which are not reinforced with stiffening elements, particularly those with high mass, typically have a low natural frequency at or close to the frequencies of typical vibrations. Under such conditions the stacks can easily resonate at their natural frequency and quickly fail if the vibrations have sufficient amplitude. As a consequence military and other specifications relating to magnetic core stack applications involving mechanical vibration typically require the stack for such applications to be stiffly constructed or reinforced so as to have substantial vibration resistance.

A common approach to the problem of designing a vibration-resistant core stack has been to add considerable sttiffness to each individual layer of the core stack. The individual layers in such stacks are typically separated by a substantial distance to prevent the cores in adjacent layers from contacting one another. Each individual layer of the cores is stiffened by a thick piece of aluminum or other material of sufficient stiffness. The result is that as each layer of the stack is provided with increased stiffness and greater separation from adjacent layers, the mass and volume of the stack increase significantly. Consequently, while the individual layers are themselves highly resistant to vibration, the composite structure of the system has a low natural or resonant frequency so as to render the stack highly susceptible to damage or failure in addition to being relatively heavy and consuming considerable space.

BRIEF DESCRIPTION OF THE INVENTION

The present invention provides magnetic core stacks capable of withstanding substantial vibration and at the same time being light in weight and compact in size. This is accomplished by fashioning the core stack into a compact configuration of low mass which at the same time achieves the requisite stiffness by being mounted on a common stiffening base member. The individual layers of the stack laminate are very thin, and at the same time are designed to provide considerable mechanical damping through the manner in which they mount the magnetic cores. Typically, each layer of the stack is comprised of a layer of magnetic cores sandwiched between opposite sheets of ground plane forming material which are coated with a soft, high damping material for receiving and supporting the cores. The ground plane forming sheets of material need not be very rigid and preferably have substantial thinness so as to reduce the thickness of each layer.

Magnetic core stacks in accordance with the invention can be fashioned from a generally planar structure mounting a single layer of magnetic cores therein. Upon formation of the planar structure, such structure is folded over upon itself one or more times to fashion the core stack into a laminate with a desired number of layers.

In one embodiment of a core stack in accordance with the invention, a generally planar arrangement is initially formed by coating a thin sheet of aluminum or other ground plane forming material with a layer of silicone rubber which vulcanizes at room temperature or similar material and mounting a layer of magnetic cores on the rubber. After threading the cores with magnet wires to complete the magnetic circuitry, the planar structure is folded over upon itself while a sheet of aluminum coated on both sides with silicone rubber is inserted into the folded structure. The result is a two layer stack with each of the layers comprising a layer of the cores sandwiched between opposite aluminum sheets by coatings of silicone rubber. The two layer stack can then be folded over upon itself one or more times to form a four or six layer core stack laminate as desired.

In an alternative embodiment of a core stack in accordance with the invention, the initial planar structure is comprised of opposite sheets of reinforced aluminum sandwiching a layer of cores therebetween. The cores are coupled to one of the sheets of aluminum through a layer of silicone rubber and to the other sheet of aluminum through a layer of silicone rubber supporting a layer of tape of silicone or similar composition. The resulting planar structure is then folded over upon itself one or more times to form the desired multilayered core stack with adjacent portions of the aluminum sheets being bonded together with an adhesive.

A preferred arrangement of a memory module in accordance with the invention is fashioned using a core stack made from a single planar layer folded over upon itself in the manner just described and having integrally formed therewith a plurality of X and Y diode boards. When the structure is folded upon itself to form the core stack, the diode boards reside in desired locations at the edges of the core stack. The core stack is coupled to a rigid member which may be of honeycomb or similar internal construction so as to also be of low mass. The diode boards are coupled to the common base member by spacers, and other electronic components are added to form the completed memory module.

BRIEF DESCRIPTION OF THE DRAWINGS

The foregoing and other objects, features and advantages of the invention will be apparent from the following more particular description of preferred embodiments of the invention, as illustrated in the accompanying drawings, in which:

FIG. 10 is a plan view of one particular arrangement of a planar structure corresponding to FIG. 1 and utilized in making a magnetic core stack in accordance with the invention;

FIG. 11 is a perspective view of the planar structure of FIG. 10 after being folded to form the core stack;

FIG. 12 is a perspective view of a memory module utilizing the core stack of FIG. 11;

DETAILED DESCRIPTION

Figure 1:
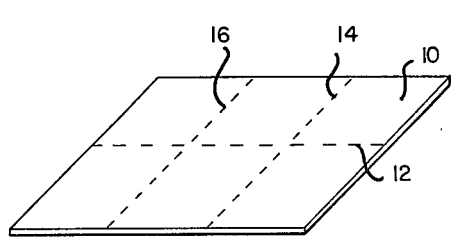
FIG. 1 is a perspective view of a generally planar structure utilized in making a core stack in accordance with the invention.

FIG. 1 depicts a generally planar structure 10 utilized in making a magnetic core stack in accordance with the invention. As described hereafter in connection with FIGS. 6-9 the structure 10 includes a layer of magnetic cores held in place by a soft material such as silicone rubber and mounted on a thin sheet of material such as aluminum forming a ground plane. In the particular example of FIG. 1, the planar structure 10 is folded over upon itself along the longitudinal axis 12 thereof, following which the structure 10 is folded over upon itself along two transverse axes 14 and 16.

Figure 2:
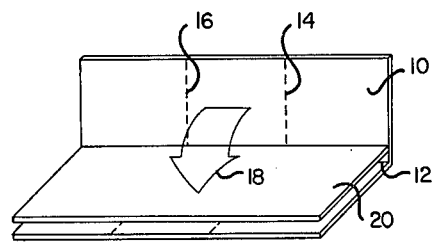
FIG. 2 is a perspective view of the structure of FIG. 1 being folded over upon itself along a longitudinal axis thereof to form a two layer core stack.

FIG. 2 depicts the operation in which the planar structure 10 is folded over upon itself along the longitudinal axis 12. The back half of the planar structure 10 as viewed in FIG. 1 is folded over and onto the front half of the structure 10 along the axis 12 as depicted by an arrow 18 in FIG. 2. Depending upon the particular construction of the planar structure 10 of FIG. 1, it may be necessary to place a generally planar insert 20 between the two folded halves of the planar structure 10 as shown in FIG. 2. The planar insert 20 is approximately equal in size to the front half or the back half of the planar structure 10.

Figure 3:
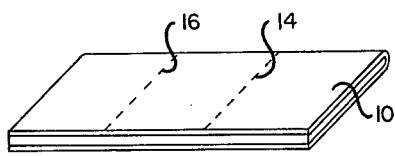
FIG. 3 is a perspective view of the two layer core stack resulting from the folding operation of FIG. 2.

FIG. 3 depicts the arrangement which results when the folding operation of FIG. 2 is completed. The arrangement of FIG. 3 comprises a two layer core stack having one half the area of the planar structure 10 of FIG. 1.

Figure 4:
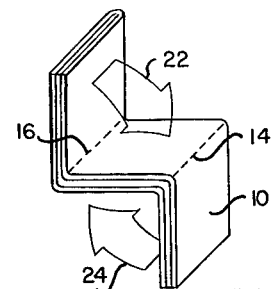
FIG. 4 is a perspective view of the core stack of FIG. 3 being folded over upon itself along two different transverse axes.

During a further step shown in FIG. 4 the arrangement of FIG. 3 is folded over upon itself along the transverse axes 14 and 16. The lefthand end of the FIG. 3 arrangement is folded upwardly and over along the axis 16 as depicted by an arrow 22 in FIG. 4. At the same time the righthand end of the FIG. 3 arrangement is folded under along the axis 14 as depicted by an arrow 24 in FIG. 4.

Figure 5:
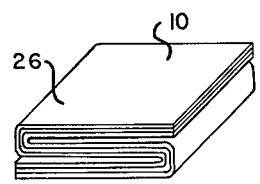
FIG. 5 is a perspective view of the six layer core stack resulting from the folding operation of FIG. 4.

The arrangement that results from the folding operation of FIG. 4 is depicted in FIG. 5. Such an arrangement comprises a completed core stack 26 which has six different layers. Each of the six different layers is comprised of a separate layer of magnetic cores. As described in detail hereafter each layer of cores is sandwiched between opposite ground planes and is mounted in a soft material which greatly enhances the mechanical damping of the stack.

Figure 6:
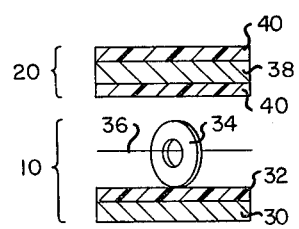
FIG. 6 is a side view depicting the edge of the planar structure of FIG. 1 and the edge of an inserted structure in accordance with one embodiment of the invention.

FIG. 6 depicts one particular embodiment of the planar structure 10 and the planar insert 20 which may be utilized in the method and resulting structure of FIGS. 1-5. In the arrangement of FIG. 6 the planar structure 10 is comprised of a thin sheet of aluminum 30 coated on the upper surface thereof with a thin layer of silicone rubber. The silicone rubber used herein is of the type which vulcanizes at room temperature. The rubber is kept refrigerated prior to use. Upon use the rubber is spread into a thin layer, magnetic cores or other stucture is added and the rubber is allowed to vulcanize by subjecting it to temperatures of 80° F. or higher.

A layer of magnetic cores is mounted on the layer of silicone rubber 32 to complete the planar structure 10. A magnetic core 34 comprising one of the cores of the core layer is depicted in FIG. 6. The individual cores of the core layer are threaded with X and Y magnet wires in conventional fashion. One such magnet wire 36 is depicted in FIG. 6. In the arrangement of FIG. 6 the planar insert 20 is comprised of a thin sheet of aluminum 38 having opposite sides coated with thin layers of silicone rubber 40.

The sheet of aluminum 30 forming a part of the planar structure 10 extends throughout the entire area of the structure 10. As shown in FIG. 2 the planar insert 20 has an area approximately one-half that of the planar structure 10. Accordingly, the thin sheet of aluminum 38 has an area one-half that of the sheet of aluminum 30 but otherwise is similar in terms of composition and thickness. The layers of silicone rubber 40 have a thickness similar to that of the layer of silicone rubber 32. Alternatively, the planar insert 20 can be comprised of different segments mounted on the planar structure 10 in spaced-apart relation to each other so as to cover different groups of the magnetic cores on the sheet of aluminum 30.

The planar structure 10 is formed by providing the sheet of aluminum 30 with the layer of silicone rubber 32 thereon, following which the magnetic cores 34 are mounted by being pressed into the layer of silicone rubber 32. The layer 32 is then allowed to vulcanize at room temperature. The cores 34 are then threaded with the magnet wires 36 to complete the planar structure 10. With the planar structure 10 of FIG. 6 completed, the structure 10 is folded over on itself along the longitudinal axis 12 with the planar insert 20 being placed therein as shown in FIG. 2.

Figure 7:
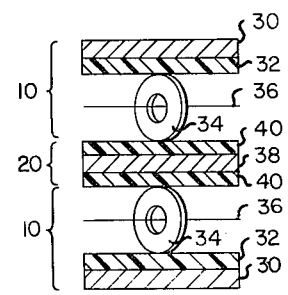
FIG. 7 is a side view of a two layer stack corresponding to FIG. 3 and which results from the structure shown in FIG. 6.

The resulting arrangement is depicted in FIG. 7 and corresponds to the structure of FIG. 3. It will be seen that each layer of the magnetic cores 34 is sandwiched between opposite ground planes formed by the sheets of aluminum 30 and 38. In addition to forming ground planes the aluminum sheets 30 and 38 act as carriers for the layers of silicone rubber 32 and 40. The sheets of aluminum 30 and 38 need not be stiff, and in fact are quite flexible because of their thinness. In a typical application the sheets of aluminum 30 and 38 are each approximately 1 mil thick. The layers of silicone rubber 32 and 40 also have a small thickness which can be as little as about 2 mils. If the magnetic cores 34 are 9 mils in diameter, then each layer of the magnetic core stack 26 which is comprised of the thickness of the planar structure 10 plus half the thickness of the planar insert 20 is no greater than about 15 mils. Consequently, the entire magnetic core stack 26 comprising six different layers has a thickness no greater than about 90 mils. In actual practice the core stack 26 may be slightly thicker since it may be desirable to coat the mating surfaces of the sheet of aluminum 30 with a thin layer of adhesive as the arrangement of FIG. 7 is folded over upon itself in the manner of FIG. 4 to form the completed core stack 26.

It will be appreciated that the core stack 26 is very thin and of very low mass. As described hereafter the entire core stack 26 is mounted on a single stiffening base which forms a mechanical ground. This combined with the low mass and thickness of the stack 26 produces a highly rugged stack capable of withstanding substantial vibration. This is due in part to the fact that the stack 26 is itself of relatively soft and flexible construction so as to provide a substantial amount of mechanical damping. The magnetic core-silicone rubber layer interface is in tension-compression, dissipating energy in the silicone rubber. Another reason that the resulting structure is so rugged and capable of withstanding vibration relates to the substantial thinness of the core stack 26. The core stack 26 when mounted on a stiff base can be likened to a vibrating cantilevered beam having a length equal to the thickness of the core stack 26. With an equivalent beam thickness on the order of 90 mils or less and cross-sectional dimensions on the order of 5"×8" or 8"×10", the resulting structure has a high natural or resonant frequency and a low Q. This can be appreciated when it is considered that the maximum deflection of a cantilevered beam is proportional to the fourth power of the beam length (stack height) assuming a constant mass per unit length. For vibrational applications of magnetic core stacks, it is typically desired that the resonant frequency of the stack be greater than 475 Hz. Structures in accordance with the invention typically have a resonant frequency well above that nominal figure and are therefore capable of withstanding severe vibration including the resonance dwell.

Figure 8:
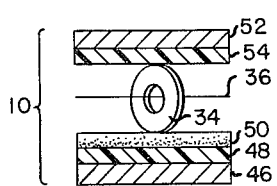
FIG. 8 is a side view depicting the edge of the planar structure of FIG. 1 in accordance with an alternative embodiment of the invention.
Figure 9:
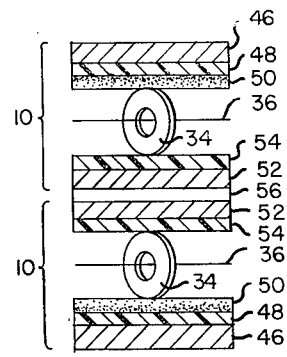
FIG. 9 is a side view of a two layer stack corresponding to FIG. 3 and which results from the structure shown in FIG. 8.

As previously pointed out the structure shown in FIGS. 6 and 7 is very thin and relatively soft. For certain applications it may be desirable to provide a more substantial core stack structure having a slightly greater stiffness at the expense of some increase in the thickness of the core stack. Such an arrangement is shown in FIGS. 8 and 9. As shown in FIG. 8 the planar structure 10 in accordance with this embodiment of the invention is built upon a substrate 46 which in the present example comprises a 4 mil thick layer of aluminum reinforced with Kapton. The aluminum within the subtrate 46 forms the ground plane. The Kapton within the substrate 46 lends considerable stiffness to facilitate both the mounting of the magnetic cores 34 and the subsequent folding of the planar structure 10. The upper surface of the substrate 46 is coated with a 2 mil thick layer of silicone rubber 48 which in turn supports a layer of tape 50. The layer of tape 50 which is approximately 5½ mils thick may be of silicon composition and is utilized to mount the magnetic cores 34.

After the magnetic cores 3 have been mounted on the layer of tape 50 and have been threaded with the magnet wires 36, the planar structure 10 is completed by the addition of an opposite substrate in the form of an array cover 52. The array cover 52 is of like size, shape and composition to the substrate 46 and has a 1 mil thick layer of RTV 54 on the lower surface thereof for contacting the cores 34.

When the planar structure 10 of FIG. 8 is folded over upon itself along the longitudinal axis 12 thereof as shown in FIG. 2, the planar insert 20 is not used. Instead, the structure 10 of FIG. 8 is simply folded over upon itself with the facing portions of the array cover 52 being bonded together with a layer of adhesive 56 so as to form the structure shown in FIG. 9 which corresponds to the two layer folded structure shown in FIG. 3. In the present example the layer of adhesive 56 comprises a 2 mil thick layer of Sylgard. As folding of the structure shown in FIG. 9 is continued in accordance with FIG. 4, the resulting facing portions of the substrate 46 are bonded together with a layer of adhesive similar to the layer 56.

FIGS. 10-15 depict the various details of a memory module 60 in accordance with the invention, the module 60 being best seen in FIG. 12. The memory module 60 utilizes a magnetic core stack 62 shown in FIG. 11 and made from a planar structure 64 shown in FIG. 10. The planar structure 64 of FIG. 10 corresponds to the structure 10 of FIG. 1 and has a central, generally rectangular portion 66 thereof having a construction identical to that shown in FIG. 8. The substrate 46 in the planar structure 64 of FIG. 10 extends beyond selected portions of the outer periphery of the central, rectangular portion 66 so as to receive and mount thereon a plurality of diode boards 68. The diode boards 68 include a Y-1 board 70 and a Y-3 board 72 at the front edge of the central, rectangular portion 66, a Y-2 board 74 at the back edge of the portion 66, an X-1 board 76 and an X-3 board 78 at the left edge of the portion 66 and an X-2 board 80 and an X-4 board 82 at the right edge of the portion 66.

The central, rectangular portion 66 of the planar structure 64 has a longitudinal axis 84 corresponding to the axis 12 of FIG. 1 and a pair of transverse axes 86 and 88 corresponding respectively to the axes 14 and 16 of FIG. 1. The axes 84, 86 and 88 divide the central, rectangular portion 66 into the six different layers of the ultimate core stack 62 in the manner of FIGS. 1-5. Each such layer is comprised of four different core areas 90. In the present example each layer is approximately 8"×10" in size and each core area 90 is comprised of approximately 400,000 cores of 9 mil diameter. This provides the core stack 64 with approximately 9.6 million cores capable of storing 512K words of 18 bits each.

While not shown in FIG. 10 for simplicity of illustration, the various magnet wires of the core areas 90 extend and couple to the various diode boards 70, 72, 74, 76, 78, 80 and 82. The magnet wires are preferably strung by machine during formation of the planar structure 64 so that the only solder joints are at the drive and sink ends of each wire.

In addition to the planar structure 64 being folded along the axes 84, 86 and 88 to form the six layer core stack 62, the substrate of the planar structure 64 is also folded along selected lines so as to properly position the various diode boards in spaced-apart relation as shown in FIG. 11 when the core stack 62 is formed. For example, the substrate in the region of the Y-1 board 70 is folded along lines 92 and 94 so that the substrate can extend upwardly from the rectangular portion 66 and then outwardly in a generally horizontal plane so as to position the Y-1 board 70 above and parallel to the core stack 62. The substrate in the region of the X-2 board 80 is folded along lines 96 and 98 so that the substrate in the region of the X-2 board 80 may extend upwardly and then outwardly in a generally horizontal plane to position the X-2 board 80 parallel to and above the core stack 62. The portions of the substrate extending to the other X and Y diode boards are similarly creased as shown in FIG. 10.

It will be seen from FIG. 11 that the resulting core stack 62 provides a very compact arrangement for the six different layers of magnetic cores while at the same time positioning the various X and Y boards in close and yet spaced-apart relation for easy access to and connection thereof.

The manner in which the core stack 62 of FIG. 11 is utilized to form the complete memory module 60 is shown in FIG. 12. As previously described core stacks in accordance with the invention which are of very low mass and substantial thinness despite the presence of multiple core layers are typically mounted on a single base member of substantial stiffness to provide the needed stiffness and resistance to vibration. In the arrangement of FIG. 12 the stiff base member is comprised of a frame 100 on which the core stack 62 is mounted using an adhesive. This is perhaps best seen in the sectional view of FIG. 14. The frame 100 has a high dynamic stiffness and at the same time is preferably of lightweight construction. In the present example, the frame 100 is made of a composite aluminum structure having an internal honeycomb core. The frame 100 is mounted on top of a thin, planar guide 102. The guide 102 is slightly larger than the frame 100 so as to extend a short distance beyond the edges of the frame 100. The protruding edges of the guide 102 are utilized in the insertion of the memory module 60 into a receiving frame structure for mounting of the module 60.

With the core stack 62 mounted on the top of the frame 100, the stack 62 is covered with a thin, planar stack cover 104. A thin, planar electronic board 106 is mounted on top of and in spaced-apart relation relative to the stack cover 104 by a plurality of spacers 108 of steel or similar construction. The Y-1 board 70 is mounted on the frame 100 by a plurality of small spacers 109. The Y-2 board 74 is mounted over and spaced apart from the board 70 by a plurality of steel spacers 110. In like fashion the Y-3 board 72 is mounted over and spaced apart from the Y-2 board 74 by a plurality of steel spacers 112. The X-3 board 78 is mounted over and spaced apart from the frame 100 by a plurality of steel spacers 114. The X-1 board 76 is mounted over and spaced apart from the X-3 board 78 by a plurality of steel spacers 116. The X-4 board 82 is mounted over and spaced apart from the frame 100 by a plurality of steel spacers 118. The X-2 board 80 is mounted over and in spaced-apart relation relative to the X-4 board 82 by a plurality of steel spacers 120.

A thin, planar electronic board 122 is mounted on the underside of the guide 102 opposite the frame 100. A thin, planar shield 124 is mounted on and spaced apart from the front portion of the electronic board 122 by a plurality of steel spacers 126. The shield 124 serves to shield a critical portion of the electronic board 122.

Figure 13:
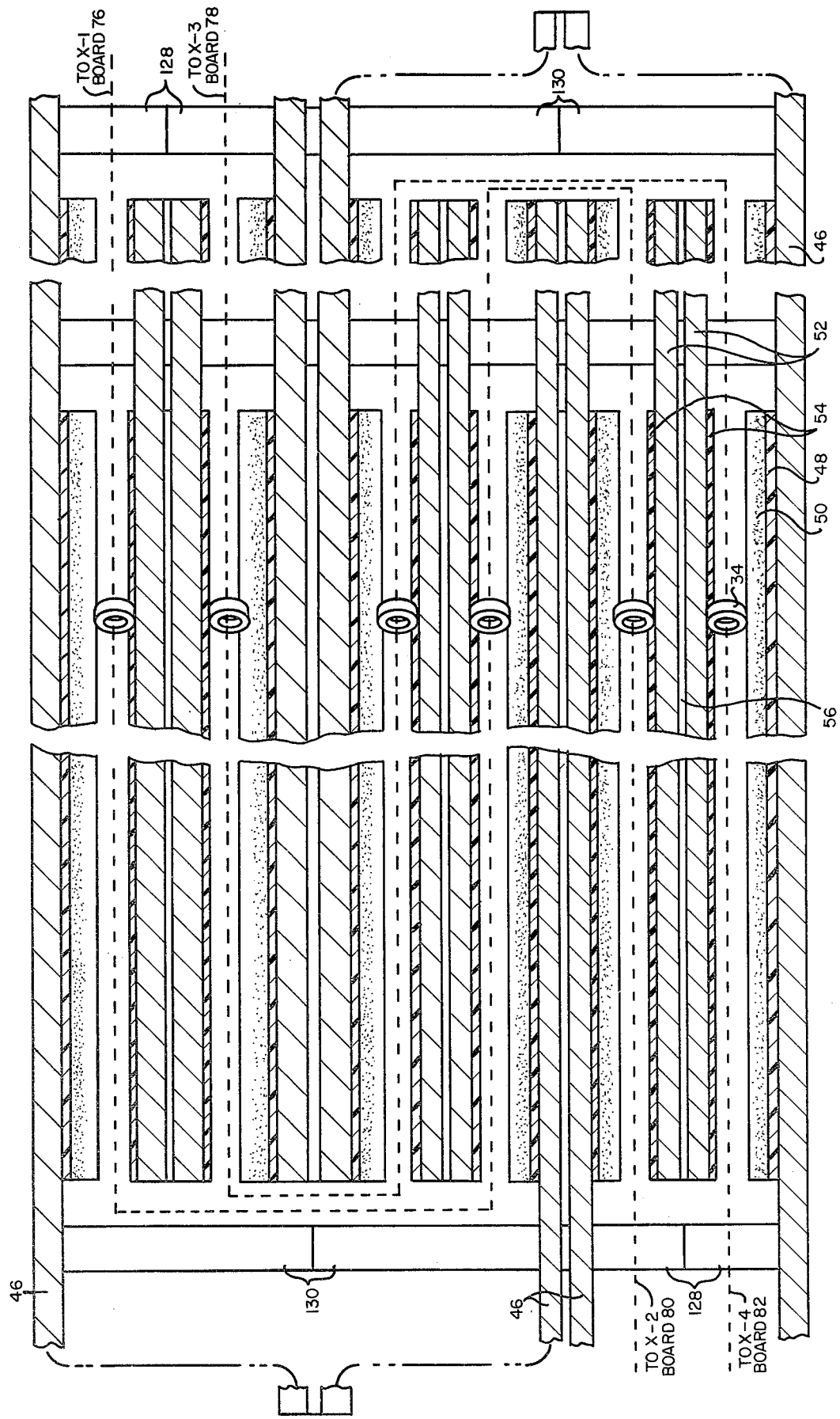
FIG. 13 is a sectional view of the memory module of FIG. 12 taken along the line 13—13' thereof.

FIG. 13 is a cross-sectional view of the core stack 62. It will be noted that the construction of the stack is the same as that shown in FIGS. 8 and 9. In FIG. 13 the various magnet wires 36 are shown as dashed lines. The different sets of wires 36 are labeled in terms of the particular X diode boards which they connect. The Y magnet wires are not shown in FIG. 13.

The core stack 62 is principally self-supporting as previously described. However to aid in the mounting and support of the various different layers of the stack a plurality of spacers of Mylar or similar material are used in the present example. The portions of the substrate 46 defining the bottom two layers of the core stack 62 are supported by pairs of spacers 128 of like size. Similarly, the portions of the substrate 46 defining the top two layers of the stack 62 are supported by pairs of the spacers 128. The portions of the substrate 46 defining the lower four layers of the stack 62 are supported by pairs of spacers 130. The spacers 130 are of like size and have a length slightly greater than twice the length of the spacers 128. Pairs of the spacers 130 are also used to support the portions of the substrate 46 defining the top four layers of the core stack 62.

Figure 14:
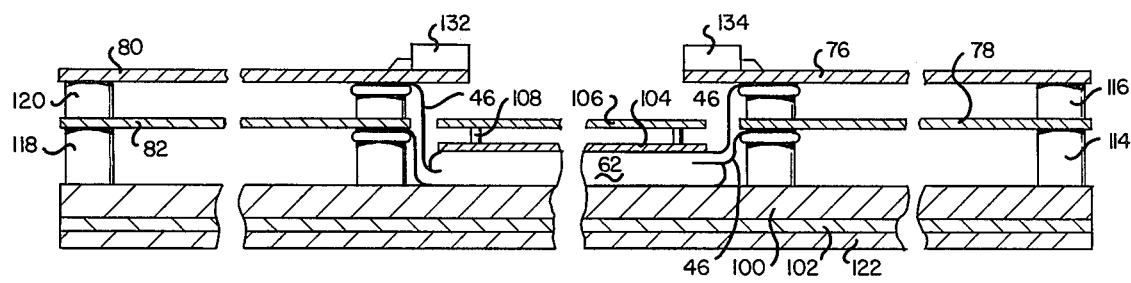
FIG. 14 is a sectional view of the memory module of FIG. 12 taken along the line 14—14' thereof.
Figure 15:
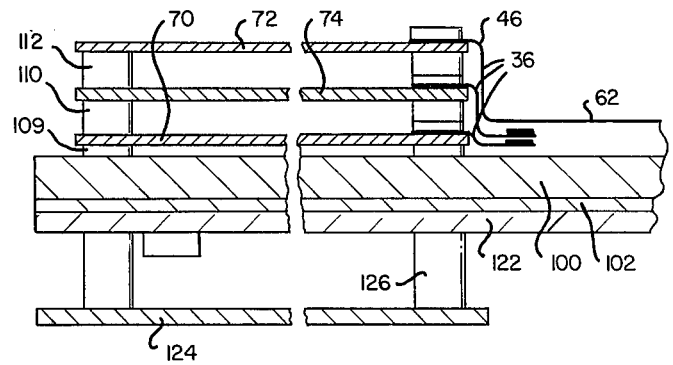
FIG. 15 is a sectional view of the memory module of FIG. 12 taken along the line 15—15' thereof.

Further details of the memory module 60 are shown in FIGS. 14 and 15. Referring to FIG. 14 it will be seen how folded portions of the substrate 46 extend from the core stack 62 and are coupled to the various X diode boards 76, 78, 80 and 82. The various X magnet wires extend along the portions of the substrate 46 and couple to the various X boards. As seen in FIG. 12 as well as in FIG. 14 a plurality of connectors 132 are mounted on the inner edge of the X-2 board 80 adjacent to the electronic board 106. The connectors 132 facilitate coupling of the electronic board 106 to the boards 80 and 82. A further plurality of connectors 134 shown in FIG. 14 but not in FIG. 12 are mounted on the inner edge of the X-1 board 76 and serve to couple the electronic board 106 to the boards 76 and 78.

FIG. 15 depicts the Y boards 70, 72 and 74. As seen in FIG. 15 portions of the substrate 46 extend from the stack 62 and mount the Y boards. These portions of the substrate 46 support the Y magnet wires which extend from the stack 62 and couple to the Y boards 70, 72 and 74. At the outer edges of the Y boards 70, 72 and 74 various wires from the boards extend downwardly and then under the frame 100 and the guide 102 where they couple to the electronic board 122.

Figure 16:
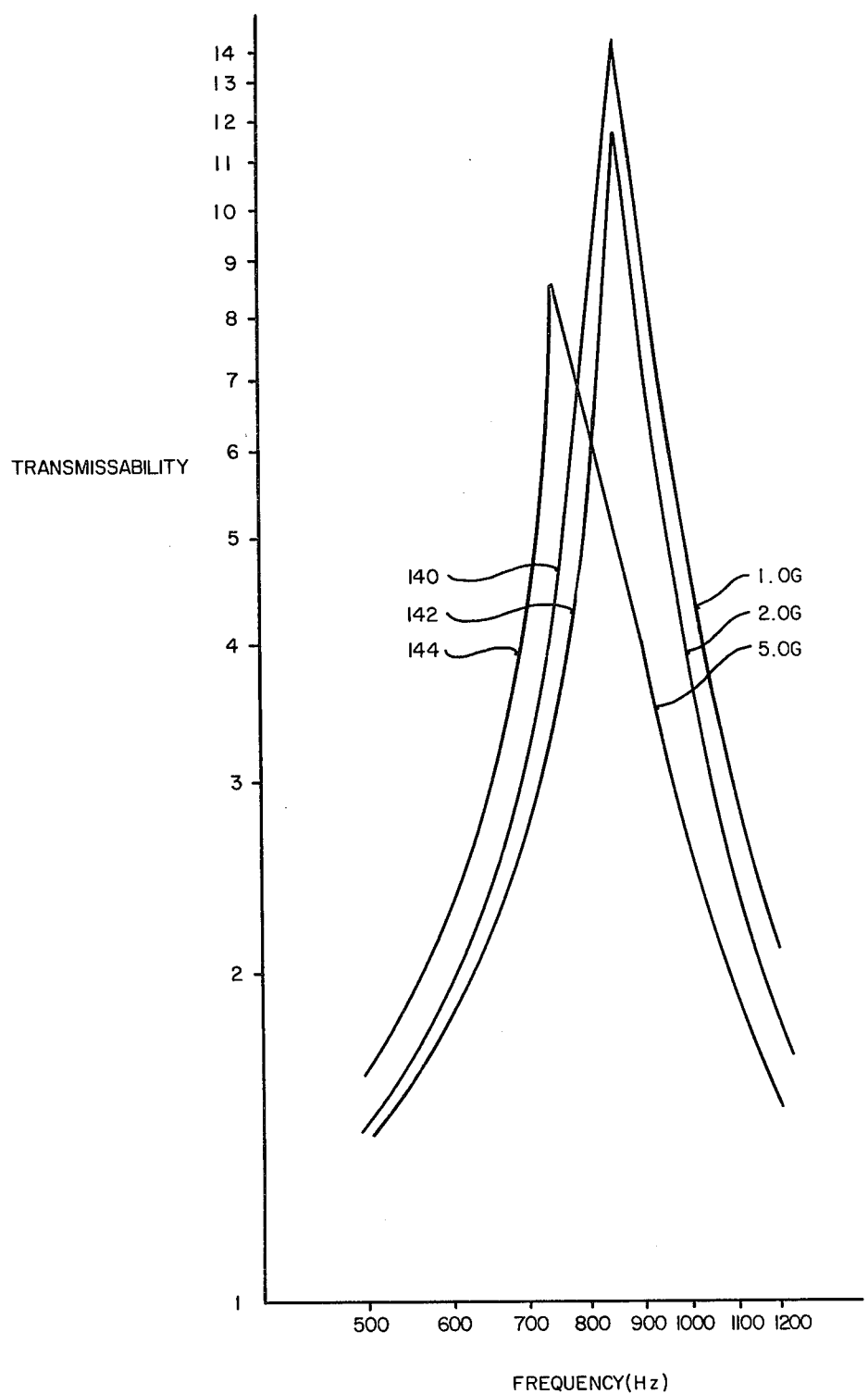
FIG. 16 comprises diagrammatic plots of transmissibility as a function of frequency at three different accelerations of a core stack in accordance with the invention.

FIG. 16 depicts the results of a vibration test performed on a single layer or plane of magnetic cores formed in accordance with the invention. The cores were 13 mils in size and the single plane had a mass of 1 lb. A first curve 140 depicts transmissibility as a function of frequency when the acceleration of the vibration was 1.0 G. A second curve 142 depicts transmissibility as a function of frequency when the acceleration of the vibration was 2.0 G. A third curve 144 depicts transmissibility as a function of frequency for a vibratory acceleration of 5.0 G.

It will be noted that in the case of the curve 140 depicting conditions at 1.0 G acceleration, the transmissibility which had a value of 1.42 at 500 hertz increased to a maximum of 14.0 at 850 hertz, then decreased to 2.12 at 1200 hertz. When the acceleration was increased to 2.0 G, then the transmissibility as depicted by the curve 142 increased from 1.4 at 500 hertz to a maximum of 12.0 at 850 hertz, then quickly decreased to 1.7 at 1200 hertz. When the acceleration was increased from 2.0 G to 5.0 G, then the transmissibility as shown by the curve 144 increased from 1.6 at 500 hertz to a maximum of 8.5 at 750 hertz, then decreased sharply to 1.5 at 1200 hertz.

The curves 140, 142 and 144 show that as the input acceleration was increased from 1.0 G to 5.0 G the transmissibility at the resonant frequency decreased from 14 to 8.5. The change in transmissibility from 14 to 8.5 indicates that there is increased damping with increased input acceleration in structures according to the invention.

It was previously indicated that the mass of the structure used in the simulated vibration tests was 1 lb. As opposed to the single core layer tested, in actual use core laminates typically have about six layers and in some cases as many as sixteen layers of cores. By the same token, the actual mass of such a core stack laminate in accordance with the invention is more on the order of 0.2 lbs. Accordingly, the resonant frequency of such a laminated stack is more typically on the order of about 1900 hertz rather than 850 hertz. At the same time the maximum transmissibility of 14 would be more on the order of 6.3. In actual practice, therefore, the effects of the conditions depicted in FIG. 16 are even less harmful. In any event FIG. 16 again depicts the fact that structures in accordance with the invention provide increased damping with increased input acceleration.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A magnetic core stack comprising the combination of:
    a multi-layer structure having a plurality of different layers arranged in a laminate, each of the layers being disposed in contact with at least one other layer of the multi-layer structure and comprising a different plurality of magnetic cores disposed between and in contact with opposite, spaced-apart sheet-like elements, the multi-layer structure having a thin sheet of folded material forming at least a portion of one of the opposite, spaced-apart sheet-like elements within each layer of the multi-layer structure; and
    a rigid base mounting the multi-layer structure thereon.

2. The invention set forth in claim 1, wherein the thin sheet of material is folded over on itself at least twice to form a structure having at least four layers.

3. A magnetic core stack comprising the combination of:
    a rigid base; and
    a laminate of core stack layers mounted on the rigid base, the laminate being of non-rigid construction and having a different plurality of magnetic cores within each layer thereof, each layer of the laminate having opposite, spaced-apart sheet-like elements disposed on opposite sides of and sandwiching a plurality of the magnetic cores therebetween, the laminate having a sheet of folded material forming at least a portion of one of the opposite, spaced-apart sheet-like elements within each layer of the laminate.

4. The invention set forth in claim 3, wherein the different pluralities of magnetic cores in adjacent layers are separated by at least one layer of thin, flexible metallic material which acts as a ground plane.

5. The invention set forth in claim 3, wherein the laminate has an average layer thickness of no greaer than 6 mils plus the diameter of the magnetic cores.

6. The invention set forth in claim 3, wherein the portion of the laminate between each adjacent pair of the pluralities of magnetic cores consists of a thin layer of flexible metal coated on the opposite sides thereof with a soft tacky material which receives the magnetic cores therein.

7. The invention set forth in claim 6, wherein the metal consists of aluminum and the soft, tacky material consists of RTV.

8. The invention set forth in claim 3, wherein the portion of the laminate between each adjacent pair of the pluralities of magnetic cores includes two thin layers of flexible metal bonded together and having opposite outer surfaces coated with a soft, tacky material which receives the magnetic cores therein.

9. The invention set forth in claim 8, wherein the soft, tacky material in the portion of the laminate between selected adjacent pairs of the pluralities of magnetic cores includes a layer of tape.

10. The invention set forth in claim 8, wherein the metal consists of aluminum and the soft, tacky material consists of RTV.

11. A magnetic core stack assembly comprising the ccombination of:
    a relatively thin, generally planar frame of rigid construction;
    a relatively thin, generally planar core stack mounted on a central portion of the frame, the core stack being of nonrigid construction and consisting of a plurality of different layers of magnetic cores separated by opposite flexible metal sheets forming ground planes and soft material coated on the metal sheets for mounting the magnetic cores between the opposite flexible metal sheet, at least one of the opposite flexible metal sheets within each layer being comprised of a folded portion of a single flexible metal sheet;
    a plurality of relatively thin, generally planar diode boards mounted on edge portions of the frame surrounding the central portion of the frame and core stack; and
    a plurality of wires threading the magnetic cores and coupled to different portions of the diode boards.

12. The invention set forth in claim 11, wherein the flexible metal sheets of the core stack form substrates for the different layers of the core stack and are held in spaced-apart relation by spacers and the diode boards are held spaced apart from the frame and from each other by spacers.

* * * * *